United States Patent [19]

Tickle

[11] 4,435,786
[45] Mar. 6, 1984

[54] SELF-REFRESHING MEMORY CELL

[75] Inventor: Andrew C. Tickle, Los Altos, Calif.

[73] Assignee: Fairchild Camera and Instrument Corporation, Mountain View, Calif.

[21] Appl. No.: 324,344

[22] Filed: Nov. 23, 1981

[51] Int. Cl.³ ............................................ G11C 11/40
[52] U.S. Cl. .................................... 365/154; 365/185; 307/279
[58] Field of Search ................ 365/154, 185; 307/279; 357/23 VT

[56] References Cited

U.S. PATENT DOCUMENTS

| | | | |
|---|---|---|---|
| 4,132,904 | 1/1979 | Harari | 365/154 |
| 4,342,101 | 7/1982 | Edwards | 365/154 |
| 4,348,745 | 9/1982 | Schmitz | 365/154 |

FOREIGN PATENT DOCUMENTS

2058451 4/1981 United Kingdom ................ 365/154

Primary Examiner—Stuart N. Hecker
Attorney, Agent, or Firm—Kenneth Olsen; Carl L. Silverman; Alan H. MacPherson

[57] ABSTRACT

A self-refreshing non-volatile memory cell having two cross-coupled transistors includes a first floating gate formed between the gate and the channel of said first transistor, said first floating gate overlying by means of a tunnel oxide a portion of the drain of said second transistor and a second floating gate formed between the gate and channel of said second transistor, a portion of said second floating gate overlying by tunnel oxide a portion of the drain of the first transistor. Disturbances in the supply voltage and the gate voltage of the device normally enhance rather than degrade the state of data stored in the cell, thereby providing an extremely long storage time for the cell. The cell is capable of operating simultaneously in a volatile and a non-volatile state.

4 Claims, 6 Drawing Figures

REPRESENTS THIN TUNNELING OXIDE UNDER FLOATING GATE ( SHOWN AS |⟵ IN FIG.1 )

LAYOUT OF CROSS-COUPLED FLOATING GATES

SELF-REFRESHING MEMORY CELL

BACKGROUND OF THE INVENTION

1. Field of the Invention

This application is related to U.S. patent application Ser. No. 324,343, filed on common date herewith and also assigned to Fairchild Camera and Instrument Corporation.

This invention relates to a self-refreshing memory cell suitable for use in an integrated circuit with increased packing density over circuits of the prior art, and to its method of operation.

2. Prior Art

Bistable memory cells are well known. Such cells are disclosed, for example, in U.S. Pat. No. 3,562,721 to Norman, issued Feb. 9, 1971. The Norman cell comprises two cross-coupled bipolar transistors connected in what has now become a standard bistable flip-flop configuration. The collector of one bipolar transistor in the cell is connected to the base of the other transistor and the emitters of the two transistors are grounded. When one transistor turns on, the collector voltage on that transistor drops thereby turning off the other transistor. The collector voltage on the off transistor then rises turning on harder the "on" transistor. The state of the cell is changed by pulsing simultaneously the collector of the cross-coupled transistor and a selected switching transistor. The state of the cell is sensed by determining the voltages on the collectors of the two transistors.

Since the disclosure of this long established cell new bistable cells have appeared, including cells using a charge stored at the interface between two dissimilar dielectrics (see, for example, U.S. Pat. No. 3,641,512 issued Feb. 8, 1972 on an invention of Frohman-Bentchkowsky) and cells using so-called "floating gates" which are conductive gates insulated from the active components of the transistor by dielectric. The charge on the floating gate is often controlled by controlling the potential on an overlying word line in such a manner as to either draw a charge from an underlying source to the floating gate or expell charge from the floating gate to the source. Such devices, often making use of electron tunnelling through a thin dielectric, are described, for example, in an article entitled "Low Power EEPROM Can Be Reprogrammed Fast", published in Electronics, July 31, 1980, by Shelton. The EEPROM, short for "Electrically Erasable Programmable Read Only Memory", has distinct advantages over the prior art memories in that the EEPROM can be erased by programming internal to the chip whereas the standard EPROM is erasable only by UV light from an external source. In addition, the EEPROM lends itself to rapid reprogramming in a simple manner with portable equipment.

SUMMARY OF THE INVENTION

This invention turns to advantage several previously thought disadvantages of the prior art bistable memory cell and combines these features with a floating gate structure to yield an EEPROM device which, surprisingly, is self-refreshing.

In accordance with one embodiment of this invention, two transistors are coupled in a bistable configuration with a floating gate sandwiched between the gate electrode and the channel region of one transistor and connected by means of tunnel oxide to a portion of the drain of the other transistor. The result is that disturbances on the voltage supply reinforce the bias charge on the floating gates and therefor reinforce the state of the cell, rather than disturb and degrade the state of the cell. Consequently, the cell is self-refreshing.

In accordance with another embodiment of this invention, two transistors are cross-coupled in a standard bistable flip-flop configuration with the gate electrode of a first transistor coupled to the drain of the second transistor. A separate load resistor connects the drain of each of the two cross-coupled transistors to a power supply. However, connected in series with each load resistor between the load resistor and the drain of its corresponding transistor is a floating gate MOS transistor of this invention. The floating gate of each transistor is separated from the underlying source, drain and channel regions of the transistor by dielectric, a portion of which is of reduced thickness over a portion of the drain. Therefore, the floating gate of each transistor is capable of having electrons tunneled to or from it through the tunnel oxide from or to its underlying drain. Consequently, this cell also is self-refreshing.

This invention provides structures which resemble conventional cross-coupled flip-flops. However, contrary to such flip-flops, the coupling in the flip-flops of this invention is AC rather than DC. The flip-flops of this invention may be written into and read from in a conventional manner. However, since the drain voltage on the active element which is off is always in the same direction as for writing, drain disturb reinforces writing assuming that the volatile information stored in the cell is the same as the non-volatile state of the cell. Should these two states be different, then a normal disturb will degrade, rather than reinforce, writing.

This invention will be more fully understood in light of the following description taken together with the drawings.

DETAILED DESCRIPTION

This invention will be described in conjunction with two embodiments. It should be understood, however, that this description is illustrative only and is not meant to limit the scope of the invention.

Figure 1:
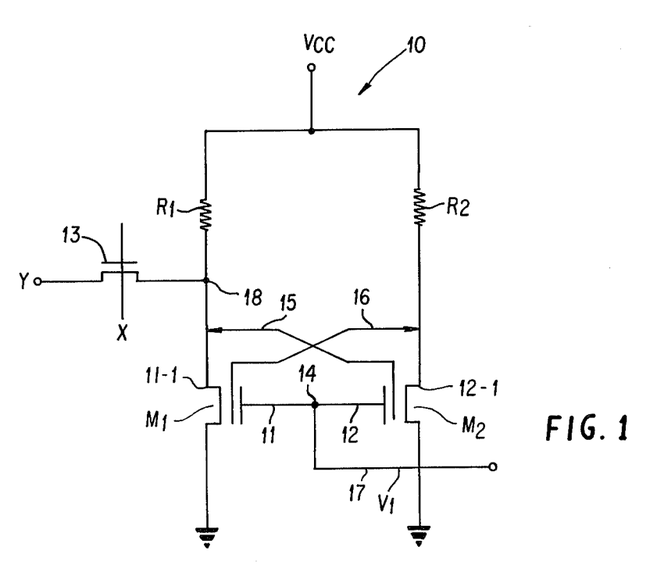
FIG. 1 shows the circuit schematic of a cell of this invention.

As shown in FIG. 1, bistable memory cell 10 comprises two MOS transistors $M_1$ and $M_2$. $M_1$ and $M_2$ are preferably N-channel devices although these devices could also be P-channel with appropriate changes in the polarities of the voltages. $M_1$ has its source grounded and its drain 11-1 connected to one terminal of resistor $R_1$, the other terminal of which is connected to power supply $V_{cc}$. A gate 11 is separate by insulation from an underlying floating gate 16. One portion of floating gate 16 is separated from the drain of $M_2$ by means of a thin tunnel oxide, typically from 50 to 200 angstroms thick, above a portion of the drain of transistor $M_2$. The gate 11 of transistor $M_1$ is connected at node 14 to the gate 12 of transistor $M_2$ and also to voltage source $V_1$ by means of lead 17.

Transistor $M_2$ has its source grounded and its drain 12-1 connected to one terminal of resistor $R_2$, the other terminal of which is also connected to voltage source $V_{CC}$. Floating gate 15 is sandwiched between gate 12 and the channel region of transistor $M_2$ but is insulated from both gate 12 and the channel region by dielectric. One portion of floating gate 15 is separated from the drain of transistor $M_1$ by means of a thin tunnel oxide (50–200Å) over a portion of the drain.

In the operation of the circuit of FIG. 1, an input signal Y is transmitted to node 18 between resistor $R_1$ and the drain of transistor $M_1$ through an MOS switching transistor 13 of conventional design.

Figure 2:
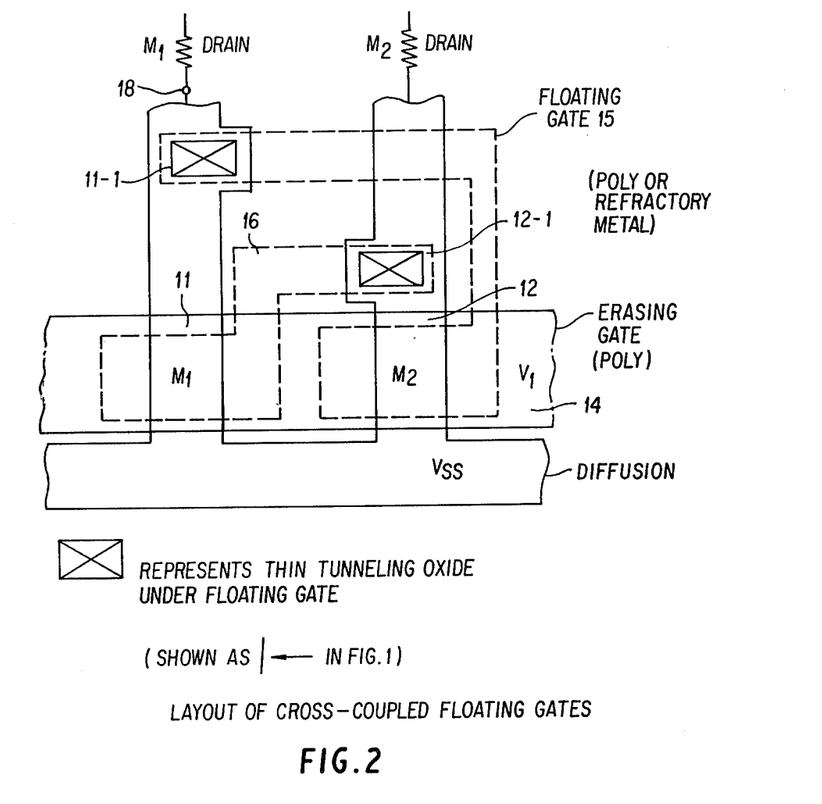
FIG. 2 shows a top view of the integrated circuit semiconductor implementation of the cross-coupled structure shown schematically in FIG. 1.

FIG. 2a shows in top view the layout of one embodiment of the circuit shown schematically in FIG. 1. In FIG. 2a, portions of the layout corresponding to circuit components in FIG. 1 are numbered identically. Ground in FIG. 1 is shown in FIG. 2a as a common source diffusion labelled $V_{SS}$. The drain regions of the two transistors $M_1$ and $M_2$ are shown in FIG. 2a as regions 11-1 and 12-1, respectively. The gates 11 and 12 of transistors $M_1$ and $M_2$ in FIG. 1, respectively, are shown in FIG. 2a as a common conductive line 14 with regions 11 and 12 overlying the corresponding channel regions of transistors $M_1$ and $M_2$ so as to act as the gate electrodes. The drains of transistors $M_1$ and $M_2$ are formed by diffusion or by ion-implantation using well-known techniques and extend, in a well-known manner, to contact resistors $R_1$ and $R_2$ respectively. Resistors $R_1$ and $R_2$ can be formed in any one of several ways and can comprise, for example, deposited resistors such as of polysilicon or nichrome on the top surface of the device insulated from the underlying substrate by dielectric or diffused resistors within the semiconductor structure itself or active load devices of well-known construction. External signals on lead Y, accessed through transistor 13 to the cell, read and write the flip-flop in a conventional manner.

Two types of memories are commonly employed—volatile and non-volatile. A volatile memory is one which loses the information stored therein immediately upon loss of power. A non-volatile memory is one which retains the information stored therein despite the loss of power. As will be seen shortly, memory cell 10 is capable of storing both volatile and non-volatile information.

In describing the operation of memory cell 10 in this specification, certain conventions will be adopted. Thus, the storage in a volatile manner of a logical one within memory cell 10 of FIG. 1 will correspond to transistor $M_1$ nonconducting and transistor $M_2$ conducting. Similarly, the storage in a volatile manner of a logical zero within memory cell 10 will correspond to transistor $M_1$ conducting and transistor $M_2$ nonconducting. The storage in a non-volatile manner of a logical one within memory cell 10 corresponds to a threshold voltage of transistor $M_2$ which is less than the threshold voltage of transistor $M_1$, and the storage in a non-volatile manner of a logical zero corresponds to a threshold voltage of transistor $M_2$ which is greater than the threshold voltage of transistor $M_1$. These conventions are summarized in Table I (wherein $V_t$ represents threshold voltage).

TABLE I

| Cell 10 (FIG. 1) | | $M_1$ | $M_2$ |
|---|---|---|---|
| Volatile | 0 | On | Off |
| Storage | 1 | Off | On |
| Non-Volatile | 0 | $V_{t1} < V_{t2}$ | |
| Storage | 1 | $V_{t1} > V_{t2}$ | |

The operation of the memory cell 10 as a volatile RAM is as follows. A data input signal is provided on lead Y (FIG. 1) through gating transistor 13 to node 18. This data input signal is high and is approximately equal to $V_{CC}$ (e.g. both the high data input signal and $V_{CC}$ are approximately 5 volts) if a one is to be written into cell 10 and is low (e.g. approximately 0 volts) if a zero is to be written into cell 10. The data input signal on node 18 is capacitively coupled to floating gate 15 of transistor $M_2$.

If the data input signal on node 18 is low, and if a normal gate voltage $V_1$, typically 5 volts, is applied to gates 11 and 12 of transistors $M_1$ and $M_2$ respectively, the voltages on gate 12 and floating gate 15 of transistor $M_2$ are insufficient to turn on transistor $M_2$, thereby causing the voltage on drain 12-1 of transistor $M_2$ to be substantially equal to $V_{CC}$. This high voltage on drain 12-1 is capacitively coupled through tunnel oxide to floating gate 16, thus increasing the gate potential of transistor $M_1$ and thus, together with the low signal voltage on node 18, causing transistor $M_1$ to conduct. With transistor $M_1$ conducting, the voltage on drain 11-1 is essentially ground. The low voltage on drain 11-1 is capacitively coupled through tunnel oxide to floating gate 15 reinforcing the turning off of $M_2$. Accordingly, transistor $M_2$ remains off and transistor $M_1$ remains on after removal of the low data input voltage from lead Y. Thus, with the application of a low data input voltage on node 18 from lead Y through gating transistor 13, a logical zero is written into cell 10.

In a similar manner, if it is desired to store in a volatile manner a logical 1 within memory cell 10, a high voltage is applied on lead Y to node 18. With a normal gate voltage $V_1$ of approximately 5 volts applied to gates 11 and 12 of transistors $M_1$ and $M_2$ respectively, the high voltage on node 18 is capacitively coupled through tunnel oxide to floating gate 15, thus increasing the gate potential of transistor $M_2$, causing transistor $M_2$ to conduct. With transistor $M_2$ conducting, the voltage on drain 12-1 is substantially ground. This low voltage on drain 12-1 is capacitively coupled through tunnel oxide to floating gate 16, thus causing a low gate voltage on transistor $M_1$, thus causing transistor $M_1$ to remain off. With transistor $M_1$ turned off, the voltage on node 18 remains essentially $V_{CC}$, even in the absence of the high data input signal from lead Y. Thus, transistor $M_2$ remains on and transistor $M_1$ remains off after the removal of the high data input signal from node 18. In this manner, a logical one is stored in a volatile manner in cell 10.

The state of the data stored in memory cell 10 in a volatile manner is determined by the voltage on node 18. To read cell 10, node 18 is connected through gating transistor 13 to lead Y which in turn is connected to a suitable sense amplifier of well known design (not shown). The sense amplifier is capable of providing an output signal corresponding to a logical one when node 18 is high (transistor $M_1$ nonconducting and transistor $M_2$ conducting), and an output signal corresponding to a logical zero when the voltage on node 18 is low (transistor $M_1$ conducting and transistor $M_2$ nonconducting).

In the volatile operation of memory cell 10, the voltages applied to node 18 and node 14 are not sufficiently high to cause electrons to tunnel through the tunnel oxide between drain 11-1 and floating gate 15, or between drain 12-1 and floating gate 16. The situation is different, however, when information is to be stored in memory cell 10 in a non-volatile manner.

Non-volatile writing into the bistable cell 10 of FIG. 1 takes place as follows. When $V_{CC}$ is raised to the writing voltage $V_W$ (typically 15-20 volts), the state of the cell (i.e. transistor $M_1$ conducting and transistor $M_2$ nonconducting or vice versa) is written into the cell in a non-volatile manner by the use of floating gates 15 and 16. Assume that cell 10 is programmed high (logical one) in a volatile manner such that transistor $M_1$ is off and transistor $M_2$ is on. The gate voltage $V_1$ is 5 volts. The drain 11-1 of transistor $M_1$ will then be high (at $V_W$), causing electrons to tunnel from the floating gate 15 of transistor $M_2$ to the drain 11-1 of transistor $M_1$, thereby lowering the threshold voltage of transistor $M_2$. Transistor $M_2$ is conducting and therefore the drain 12-1 of transistor $M_2$ is low. Thus no electrons will tunnel into or out of floating gate 16, and the threshold voltage of transistor $M_1$ is not affected. There is no tunnelling within the active structures of transistors $M_1$ and $M_2$ but rather only in the external tunnelling regions associated with the drains of these two transistors, because these are the only two regions of the device in which the oxide is thin enough (50-200Å) to permit tunneling. Thus, the threshold voltage $V_{t2}$ of transistor $M_2$ is programmed to be less than the threshold voltage $V_{t1}$ of transistor $M_1$ which, as previously mentioned, corresponds to the non-volatile storage of a logical one in cell 10.

In a similar manner, if cell 10 is programmed low in a volatile manner such that transistor $M_1$ is on and transistor $M_2$ is off, when $V_{CC}$ is raised to the writing voltage $V_W$, drain 12-1 is high ($V_W$), thus causing electrons to tunnel from floating gate 16 of transistor $M_1$ to the drain 12-1 of transistor $M_2$, thereby lowering the threshold voltage of transistor $M_1$. Transistor $M_1$ is conducting and the drain 11-1 of transistor $M_1$ is low. Thus no electrons will tunnel into or out of floating gate 15, and the threshold voltage of transistor $M_2$ is not affected. Thus, the threshold voltage of transistor $M_1$ is programmed to be less than the threshold voltage of transistor $M_2$ which, as previously mentioned, corresponds to the nonvolatile storage of a logical zero in cell 10.

Once data has been stored in a non-volatile manner in memory cell 10, upon normal power-up of memory cell 10 by the application of $V_{CC}$ and $V_1$ to the circuit, the data stored in a non-volatile manner determines the initial state of cell 10. For example, if a logical 1 is stored in a non-volatile manner in cell 10 such that the threshold voltage of transistor $M_2$ is less than the threshold voltage of transistor $M_1$, upon the application of $V_{cc}$ (approximately 5 volts) and gate voltage $V_1$ (also approximately 5 volts) to gates 11 and 12 of transistors $M_1$ and $M_2$ respectively, transistor $M_2$ will turn on first, thereby lowering the voltage on drain 12-1 to ground. This low voltage on drain 12-1 is capacitively coupled through tunnel oxide to floating gate 16 of transistor $M_1$, thus causing transistor $M_1$ to remain off. Thus, transistor $M_2$ is on and transistor $M_1$ is off, corresponding to a logical one. In a similar fashion, if a logical 0 is stored in a non-volatile manner in memory cell 10 such that the threshold voltage of transistor $M_1$ is less than the threshold voltage of transistor $M_2$, upon power-up, transistor $M_1$ will turn on first, thereby lowering the voltage on drain 11-1 to ground. This low voltage on drain 11-1 is capacitively coupled through tunnel oxide to floating gate 15 of transistor $M_2$, thus preventing transistor $M_2$ from turning on, resulting in the flip-flop comprising transistors $M_1$ and $M_2$ being set to a logical zero.

Erasure of the data stored in cell 10 in a non-volatile manner is performed by increasing $V_1$ applied to gates 11 and 12 of transistors $M_1$ and $M_2$, respectively, to the erase voltage $V_E$ of approximately 20-25 volts. If $V_{CC}$ is five volts, then both $M_1$ and $M_2$ turn on, thereby ensuring equal drain voltages on these two devices. Tunneling occurs such that the same amount of charge is stored on each floating gate and the circuit is balanced upon completion of erase. Erase, which corresponds to the tunnelling of electrons from the drains 11-1 and 12-1 of the transistors $M_1$ and $M_2$, respectively, to the floating gates 15 and 16, respectively, results in an increase in the threshold voltages of transistors $M_1$ and $M_2$. The actual threshold voltages of $M_1$ and $M_2$ are varied by varying the magnitude and duration of the erase signal. It is not required to drive the threshold voltages of transistors $M_1$ and $M_2$ into heavy enhancement since the cell 10 is capable of operating in the depletion mode.

Figure 3:
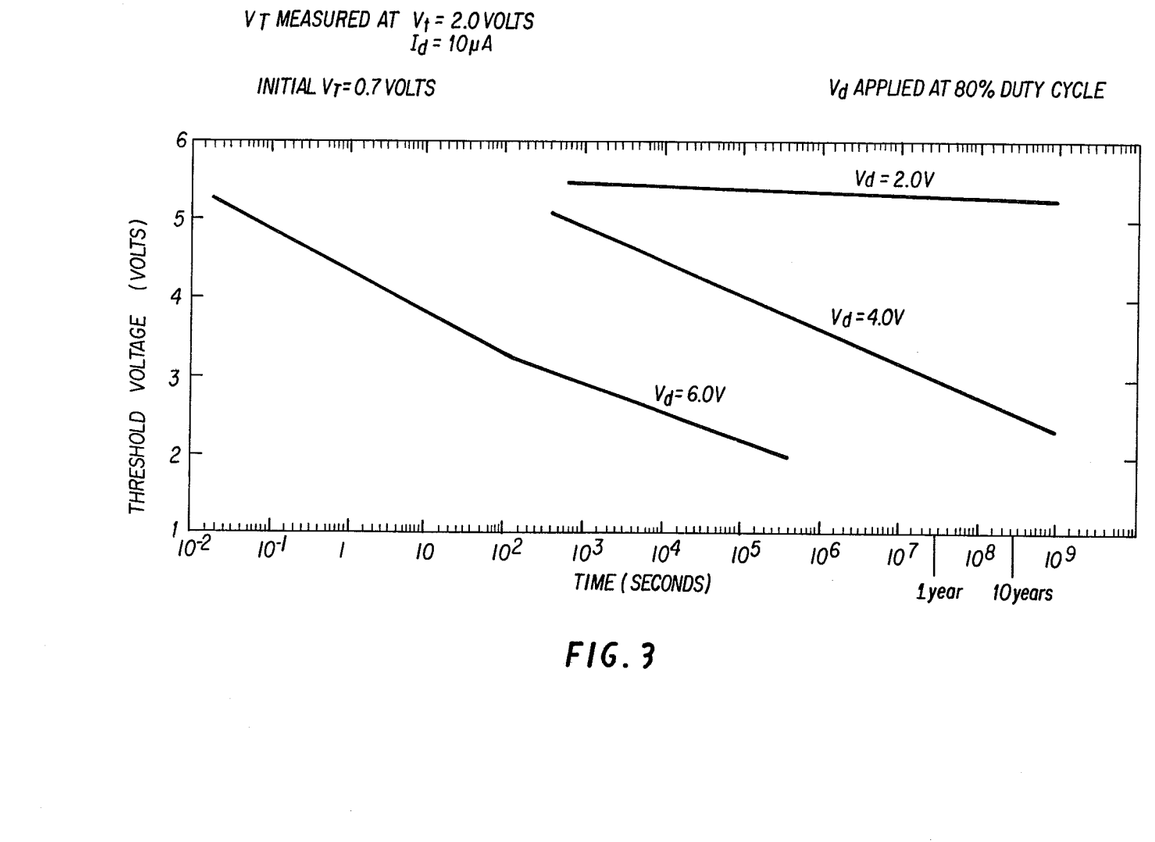
FIG. 3 shows graphically an example of the change in threshold voltage with time for the structure of this invention.

Since the floating gates 15 and 16 of transistors $M_2$ and $M_1$ are well insulated, the charge on the floating gates will hold the flip-flop in a static state for an extremely long period of time as shown in FIG. 3. FIG. 3 illustrates the floating gate voltage with respect to time for different levels of drain voltages. For a drain voltage of 2 volts, the effective threshold voltage of the device remains constant for in excess of $10^9$ seconds which corresponds to about 33 years. In this time, the voltage on the floating gate decays only by about 0.3 volts. Accordingly, this device has the ability to hold charge over an extremely long time. However, the charge can be easily erased by merely raising the voltage on lead 17 to a high level. The erasure occurs in a fraction of a second (typically about 100 milliseconds).

The cell of this invention, therefore, may be used in two modes, a non-volatile mode wherein the cell comprises a non-volatile static RAM and a volatile mode in which the flip-flop operates as a volatile static RAM cell. However if desired, volatile data can be stored non-volatilely provided the cell has already been erased. To do this, prior to powering down, $V_{CC}$ is raised to $V_W$ for a few milliseconds. The volatile data in the cell is converted to non-volatile data through the tunnelling of electrons in the manner described above. The cell's floating gates therefore retain in a non-volatile manner the electrons indicative of the volatile state of the cell prior to powering down. As shown in FIG. 3, the cell can hold this data for many years, if necessary. As a feature of this invention, the data transfer to non-volatile storage occurs simultaneously for all bits in the memory.

Suitable circuitry (not shown) can be utilized for determining when power-down is about to occur. For example, circuitry can be used which determines when $V_{CC}$ drops to a predetermined level below normal. Alternatively, a suitable signal may be provided by the system (such as a computer system, for example) in which the memory cell of this invention is utilized, thus instructing memory cell 10 to write the volatile data in the cell in a non-volatile manner, as described above. The writing voltage $V_W$ may be provided during power-down by a capacitor, for example, which has been charged during normal powered operation of the memory cell 10.

As an additional feature of this invention, two bits may be stored in each cell, one comprising a volatile storage and the other a non-volatile storage. Thus, the cell can be operated as a volatile static memory cell in the standard manner but additionally can have stored on the floating gates of each cell a bit of data corresponding to a different state (for example, "bootstrap" data to be utilized upon initialization or power-up of the device). The cell is then operated by ensuring that the drive voltages used to operate the cell in its volatile storage mode are sufficient to overcome the non-volatile information stored in the cell.

The enhancement of the state of the cell due to a disturb voltage is illustrated by assuming $M_1$ to be on and $M_2$ to be off. Of importance, most voltage disturbances encountered in memory devices such as the memory cell 10 of this invention are sudden increases in voltage, rather than decreases in voltage. When $M_2$ is off, the voltage on drain 12-1 of transistor $M_2$ is high, approximately $V_{CC}$, while the voltage on the drain 11-1 of transistor $M_1$ is low, approximately ground. Should $V_{CC}$ be driven high by a disturbance, the effect is to remove electrons from floating gate 16, thereby turning on transistor $M_1$ harder and reinforcing the state of the circuit. Floating gate 15 is not affected because it is connected through tunnel oxide to the drain 11-1 of transistor $M_1$ which is substantially at ground. Should $V_1$ (the gate voltage on lead 17) go substantially positive, the effect is to draw further electrons onto floating gate 15, thereby further turning off transistor $M_2$. $V_1$ will have little effect on floating gate 16 because this floating gate is connected through tunnel oxide to a high potential on the drain 12-1 of transistor $M_2$ and an increase in the voltage $V_1$ merely reduces the difference between the potential on floating gate 16 and $V_{CC}$. Thus, it is seen that the normal disturbing voltages are in such a direction as to enhance the storage of information in the cell rather than degrade the storage of information. Of course, if the non-volatile bit is opposite to the volatile bit, the non-volatile bit state is degraded rather than enhanced by positive disturb voltages on $V_{CC}$.

Figure 4:
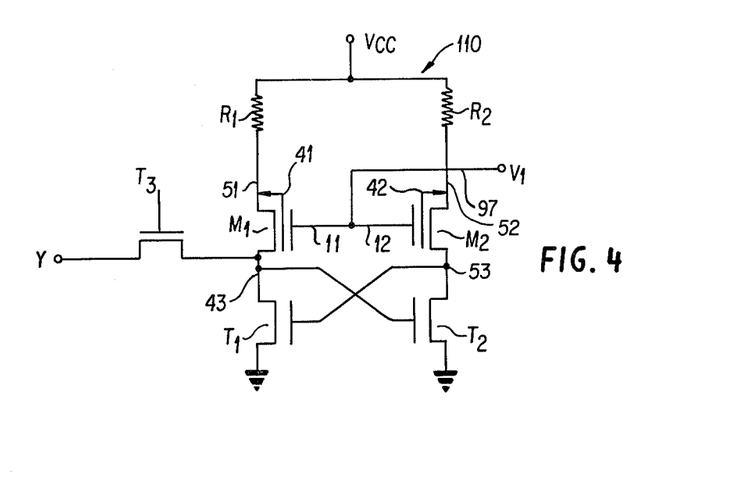
FIG. 4 is a schematic diagram of another embodiment of this invention.

FIG. 4 shows another embodiment of this invention. In FIG. 4, resistors $R_1$ and $R_2$ (which may be, for example, active MOS transistor loads or polysilicon resistors) and conventional MOS transistors $T_1$ and $T_2$ form a conventional cross-coupled static flip-flop such as disclosed, for example, in Craft et al. U.S. Pat. No. 3,530,443. However, in accordance with this invention, memory transistors $M_1$ and $M_2$ are added between resistors $R_1$ and $R_2$ and transistors $T_1$ and $T_2$, respectively.

In describing the operation of memory cell 110 in this specification, certain conventions will be adopted. Thus, the storage in a volatile manner of a logical one within memory cell 110 of FIG. 4 will correspond to transistor $T_1$ nonconducting and transistor $T_2$ conducting. Similarly, the storage in a volatile manner of a logical zero within memory cell 110 will correspond to transistor $T_1$ conducting and transistor $T_2$ nonconducting. The storage in a non-volatile manner of a logical one within memory cell 11 corresponds to a threshold voltage of transistor $M_1$ which is less than the threshold voltage of transistor $M_2$, and the storage in a non-volatile manner of a logical zero corresponds to a threshold voltage of transistor $M_1$ which is greater than the threshold voltage of transistor $M_2$. These conventions are summarized in Table II (where $V_t$ represents threshold voltage).

TABLE II

| | Cell 110 (FIG. 4) | | | |
|---|---|---|---|---|
| | $M_1$ | $M_2$ | $T_1$ | $T_2$ |
| Volatile Storage | 0 | | On | Off |
| | 1 | | Off | On |
| Non-Volatile Storage | 0 | $V_{t1} > V_{t2}$ | On | Off |
| | 1 | $V_{t1} < V_{t2}$ | Off | On |

If voltage $V_1$ applied to gates 11 and 12 of transistors $M_1$ and $M_2$ respectively is sufficiently high to turn on both transistors $M_1$ and $M_2$, the memory cell 110 functions as a volatile flip-flop, with its logical state (zero or one) being determined by the data input signal placed on node 43 in a similar fashion as has been described for memory cell 10 of FIG. 1. Furthermore, the logical state of memory cell 110 is read, in a manner described above for memory cell 10 of FIG. 1, by suitable sense applifiers (not shown) connected to node 43 through gating transistor T3 and lead Y.

If memory transistors $M_1$ and $M_2$ are turned on and have equal threshold voltages, then transistors $M_1$ and $M_2$ have no effect on the operation of the flip-flop formed by transistors $T_1$ and $T_2$ and the state of the flip-flop is set by the level of the signal on lead Y, just as described above in conjunction with the volatile operation of memory cell 10 in FIG. 1. On the other hand, if, for example, a logical one has been stored in cell 110 in a non-volatile manner, transistor $M_1$ has a lower threshold voltage than transistor $M_2$. The transistor with the lower threshold ($M_1$) will determine the state of the flip-flop comprising transistors $T_1$ and $T_2$ when voltages $V_{CC}$ and $V_1$ are initially applied to the device. Thus, if signal $V_1$ is supplied on lead 97 to the gates 11 and 12 of transistors $M_1$ and $M_2$, respectively, and $V_{CC}$ is on, transistor $M_1$ turns on first, thereby allowing $V_{cc}$ to be applied to the gate of transistor $T_2$, thereby turning on transistor $T_2$. The turning on of transistor $T_2$ causes node 53, connected to the gate of transistor $T_1$, to be substantially at ground, thus preventing transistor $T_1$ from turning on. Thus, the non-volatile storage of a logical one in memory cell 110 results in the setting of the flip-flop formed by transistors $T_1$ and $T_2$ to a logical one during power-up.

On the other hand, if a logical zero has been stored in cell 110 in a non-volatile manner, transistor $M_1$ has a higher threshold voltage than transistor $M_2$. When signal $V_1$ is supplied on lead 97 to the gates 11 and 12 of transistors $M_1$ and $M_2$ respectively, transistor $M_2$ turns on first, thereby allowing $V_{cc}$ to be applied to the gate of transistor $T_1$, thereby turning on transistor $T_1$. The turning on of transistor $T_1$ causes node 43, connected to the gate of transistor $T_2$, to drop substantially to ground, thus preventing transistor $T_2$ from turning on. Thus, the storage of a logical zero in memory cell 110 results in the setting of the flip-flop formed by transistors $T_1$ and $T_2$ to a logical zero upon power-up.

In a manner similar to cell 10, programming cell 110 in a non-volatile manner is accomplished by controlling the threshold voltages of transistors $M_1$ and $M_2$. The threshold voltages of transistors $M_1$ and $M_2$ can be controlled by the charges on the floating gates 41 and 42 of these two transistors. Thus, the removal of electrons from floating gate 41, for example, lowers the threshold voltage of transistor $M_1$ when transistor $M_1$ is an N channel device and similarly, the addition of electrons to the floating gate 41 of transistor $M_1$ raises the threshold voltage of $M_1$ when $M_1$ is an N channel device.

The state of the cell 110 is programmed in a non-volatile manner as follows. The threshold voltages of transistors $M_1$ and $M_2$ are written by raising the supply voltage $V_{CC}$ to the writing voltage $V_W$ (typically 10–25 volts), with $V_1$ at ground. An external signal Y may be applied through transistor T3 to drain 43 to determine the state of the cell to be programmed. Assuming a logical one is stored in cell 110 in a volatile manner, transistors $T_1$ and $M_1$ will be off and transistors $T_2$ and $M_2$ will be on. When $V_{CC}$ reaches $V_W$, writing (decreasing threshold) starts in $M_1$ and $M_2$. The drain voltage of transistor $M_1$ is substantially $V_W$ and electrons are drawn from floating gate 41 to drain 51 through tunnel oxide located between the floating gate 41 and the drain 51 of transistor $M_1$, thereby decreasing the threshold voltage of transistor $M_1$ relative to the threshold voltage of transistor $M_2$. Because $T_2$ is on and trying to conduct current, $M_2$ will turn on and conduct as soon as its threshold crosses the depletion level (negative threshold). The voltage drop across $R_2$ then reduces the drain voltage on drain 52, thereby limiting further writing. Because $T_1$ is off, $M_1$ cannot conduct and thus transistor $M_1$ moves further into depletion (i.e. further on) than $M_2$. As the drain 52 and the floating gate 42 of transistor $M_2$ drops from $V_W$ (the writing voltage) tunnelling of electrons between floating gate 42 and drain 52 of transistor $M_2$ stops.

Alternatively, if a logical zero is stored in cell 110 in a volatile manner, transistors $T_1$ and $M_1$ will be on and transistors $T_2$ and $M_2$ will be off. Because transistor $T_2$ is off, the gate voltage on transistor $T_1$ is relatively high-level, therefore holding transistor $T_1$ on. Transistors $T_2$ and $M_2$ are not conducting; thus drain 52 of transistor $M_2$ is substantially at $V_{CC}$. Raising $V_{CC}$ to the high level write voltage $V_W$ results in electrons tunnelling from the floating gate 42 of transistor $M_2$ through the tunnel oxide to the drain 52 of transistor $M_2$ in a manner analogous to that described above for the storage of a logical one. Therefore the threshold voltage of transistor $M_2$ decreases relative to the threshold voltage of transistor $M_1$.

Upon power-up of memory cell 11, a voltage $V_1$ (typically the same as $V_{cc} = 5$ volts) is supplied to gates 11 and 12 of transistors $M_1$ and $M_2$ respectively. The transistor $M_1$ or $M_2$ having the lower threshold voltage will turn on first, thus determining the state of the flip-flop formed by transistors $T_1$ and $T_2$. For example, if a logical one was stored in memory cell 110 in a non-volatile manner prior to power-down, the threshold voltage of transistor $M_1$ will be less than the threshold voltage of transistor $M_2$. Thus, upon power-up, transistor $M_1$ turns on first, applying $V_{cc}$ through resistor $R_1$ to node 43 connected to the gate of transistor $T_2$, thus causing transistor $T_2$ to turn on. With transistor $T_2$ conducting, drain 53 of transistor $T_2$ is substantially at ground, thus preventing transistor $T_1$ from turning on. Thus the flip-flop comprising transistors $T_1$ and $T_2$ is set to a logical one.

On the other hand, if a logical zero was stored in memory cell 110 in a non-volatile manner prior to power-down, the threshold voltage of transistor $M_2$ is less than the threshold voltage of transistor $M_1$. Thus, on power-up, a voltage $V_1$ is applied to gates 11 and 12 of transistors $M_1$ and $M_2$ respectively, and $V_{CC}$ is supplied to the circuit, causing transistor $M_2$ to turn on before transistor $M_1$ turns on. With transistor $M_2$ turned on, a high voltage is applied from $V_{cc}$ through $R_2$ to node 53 connected to the gate of transistor $T_1$. Transistor $T_1$ then turns on, driving the voltage on node 43 applied to the gate of transistor $T_2$ to ground. Thus transistor $T_2$ is prevented from turning on, and the flip-flop comprising transistors $T_1$ and $T_2$ is set to a logical zero.

In order to store the state of the flip-flop in a non-volatile manner, $V_{cc}$ is raised to the writing voltage $V_w$ (approximately 10–25 volts). The effect of this writing voltage $V_w$ is to draw electrons from the floating gate of the non-conducting transistor $M_1$ or $M_2$, thereby lowering the threshold voltage of the non-conducting transistor $M_1$ or $M_2$. For example, if a logical one is written in cell 11 in a volatile manner, transistor $T_1$ will be off, and thus transistor $M_1$ will be non-conducting, and transistor $T_2$ will be on and thus transistor $M_2$ will be conducting. With $V_{cc}$ equal to the writing voltage $V_w$, the drain 51 is essentially $V_w$, thus causing electrons to tunnel from floating gate 41 to drain 51, thus decreasing the threshold voltage of transistor $M_1$. Because transistors $M_2$ and $T_2$ are conducting, drain 52 is substantially at ground, thus preventing the tunnelling of electrons from floating gate 42 to drain 52 of transistor $M_2$. On the other hand, if a logical 0 is contained in a volatile manner in cell 11, and $V_{cc}$ is raised to $V_w$, transistors $M_2$ and $T_2$ will be non-conducting, and drain 52 will be essentially at $V_w$. This causes electrons to tunnel from floating gate 42 to drain 52 of transistor $M_2$, thus decreasing the threshold voltage of transistor $M_2$. With transistors $M_1$ and $T_1$ conducting, drain 51 is essentially at ground, thus preventing the tunnelling of electrons from floating gate 41 to drain 51 of transistor $M_1$. Thus, the threshold voltage of transistor $M_2$ is made lower than the threshold votage of transistor $M_1$, corresponding to the non-volatile storage of a logical 0 in cell 11.

The self-refreshing nature of the cell 11 during normal operation ($V_{cc} = 5$ volts) becomes apparent from the following explanation. With transistor $T_1$ not conducting, the drain 51 of transistor $M_1$ will always be at $V_{cc}$ (typically 5 volts). This is sufficient to cause a slow writing effect reinforcing the stored data as shown in FIG. 3. $M_2$ has a voltage close to ground at its drain and therefore has no reinforcing disturbing effect.

To erase data stored in a non-volatile manner within the memory cell 11, the circuit is unpowered ($V_{CC}$ floating or zero volts) and $V_1$ is set at the erase voltage $V_E$ (typically +20 to +25 volts). The thresholds of transistors $M_1$ and $M_2$ will be increased to an equal level by the tunneling of electrons to floating gates 41 and 42 from drains 51 and 52, respectively. Erasure typically takes a few seconds.

Erasure may also be performed with the circuit active ($V_{CC} = 5$ volts) since $V_E$ turns $M_1$ and $M_2$ on harder and does not affect the state of the flip-flop. However, the presence of a positive voltage on the drain of either transistor 43 or 53 during active operation of the memory cell 11 slightly reduces the erasing effectiveness of that transistor. This would result in a difference between the threshold voltages of transistors $M_1$ and $M_2$. If the erasure is performed with memory cell 11 active, the signal Y used to set the state of the transistors $M_1$, $M_2$ and $T_1$ and $T_2$ during volatile operation must override this threshold difference, allowing both transistors $M_1$ and $M_2$ to conduct during volatile operation of memory cell 11.

Just as with the cell of FIG. 1, the cell of FIG. 4 may be used as a non-volatile static RAM in which the flip-flop operates as a normal active memory cell. Then prior to powering down, provided that the cell has previously been erased, $V_{CC}$ is raised to $V_W$ for a few milliseconds to provide non-volatile storage until power is restored. The data transfer to non-volatile storage occurs simultaneously for all bits in the memory. Also, as with the cell shown in FIG. 1, two bits may be stored in each cell, one volatile and the other non-volatile.

High temperature and high reliability margins are increased for the cells of this invention since the write disturb increases margins rather than reducing them. The circuits of this invention are particularly useful in a family of erasable memories compatible with UV erasable EPROMS for fault isolating decoders. The disclosed structures are compatible with existing standard products and are useful in high reliability and high temperature circuits. The circuits are advantageous because they can be erased and altered in the system.

Figure 5A:
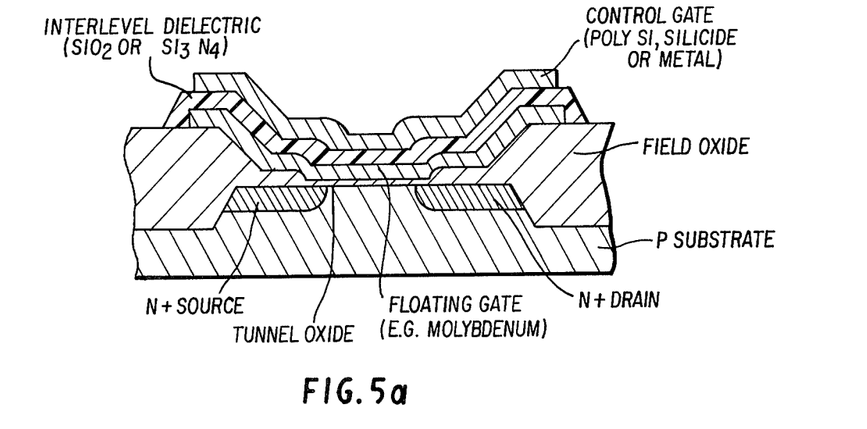
FIGS. 5a and 5b illustrate in cross-section the floating gate and tunnel oxide structures of a type useful in the semiconductor integrated circuit implementations of the circuits of this invention.
Figure 5B:
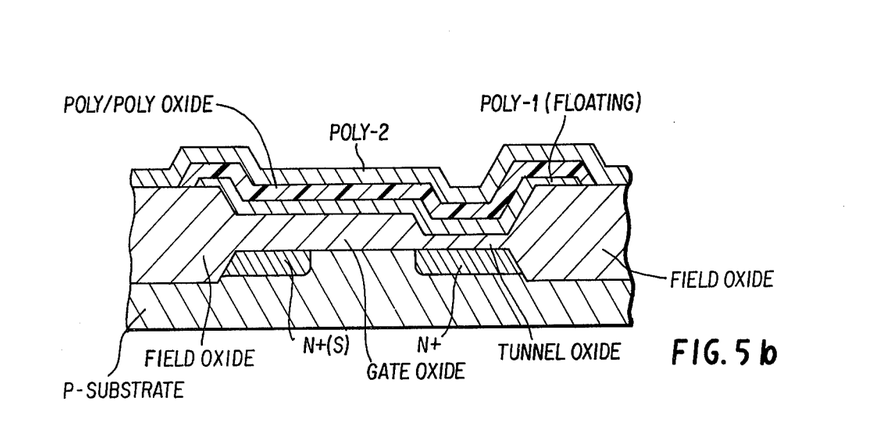

FIG. 5a illustrates in cross section a semiconductor device particularly suited for implementing the structure shown in FIG. 1. P-type substrate (typically <100> material with a resistivity of 2-50 Ω-cm) has formed in it N+ source and drain regions using well-known processing techniques. Formed over the surface of the active region of the device is a gate oxide and formed over the gate oxide is a floating gate of a conductive material such as doped polycrystalline silicon or molybdenum. On top of the floating gate is formed dielectric (typically silicon dioxide or silicon nitride) and on top of this dielectric is formed a control gate. The control gate is again formed of doped polycrystalline silicon, a silicide or selected metal such as aluminum and is capacitively coupled to the floating gate. As shown in FIG. 5b, the tunnelling oxide portion is formed directly over the drain such that electrons can tunnel in response to the proper voltages applied to the drain and the floating gate from one to the other. Overlying the floating gate but separated therefrom by dielectric is a control gate typically formed of doped polycrystalline silicon. This control gate is capacitively coupled to the floating gate so as to control the potential of the floating gate.

Other embodiments of this invention will be obvious to those skilled in the art in view of this disclosure.

What is claimed is:

1. A memory cell comprising:
  a first MOS transistor and a second MOS transistor, each of said first and second MOS transistors possessing a source, a drain, and a control gate;
  a third MOS transistor and a fourth MOS transistor, each of said third and fourth MOS transistors possessing a source, a drain, and a control gate;
  a pair of resistive elements, one lead of each resistive element being connected to a corresponding drain of one of said third and fourth MOS transistors, the other lead of each resistive element being connected to a voltage source;
  a first floating gate positioned between the gate and the channel of said third MOS transistor but insulated therefrom and having a portion extending above but separated by dielectric from the drain of said third MOS transistor, said dielectric having a portion thereof sufficiently thin to allow electrons to tunnel therethrough between the drain of said third MOS transistor and said first floating gate;
  a second floating gate positioned between the gate and the channel of said fourth MOS transistor but insulated therefrom and having a portion extending above but separated by dielectric from the drain of said fourth MOS transistor, said dielectric having a portion thereof sufficiently thin to allow electrons to tunnel therethrough between the drain of said fourth MOS transistor and said second floating gate;
  means connecting the control gates of said third and fourth MOS transistors to a source of gate potential;
  means connecting the control gate of said first MOS transistor to the drain of said second MOS transistor; and
  means connecting the control gate of said second MOS transistor to the drain of said first MOS transistor.

2. Structure as in claim 1 including means connected to the drain of said first MOS transistor for providing a signal to said memory circuit, thereby to control the state of said memory circuit, and for reading out in response to selected signals the state of said memory circuit.

3. Structure as in claim 2 wherein said means for providing a signal to and for reading out the state of said memory circuit includes:
  means for applying a first or a second signal to said memory cell thereby to control the state of said memory cell;
  means for sensing the state of said memory cell; and
  means for coupling said means for applying and said means for sensing to said memory cell.

4. Structure as in claim 3 wherein said means for coupling comprises a switching transistor.

* * * * *

UNITED STATES PATENT AND TRADEMARK OFFICE
CERTIFICATE OF CORRECTION

PATENT NO. : 4,435,786
DATED : March 6, 1984
INVENTOR(S) : Andrew C. Tickle

It is certified that error appears in the above—identified patent and that said Letters Patent is hereby corrected as shown below:

In column 3, lines 21, 23, 25, 27 and 30 delete "FIG. 2a" and insert --FIG. 2--.

In column 4, TABLE I, lines 9 and 11, delete "$V_{t\ell}$" and insert --$V_{t1}$--.

In column 8, TABLE II, lines 15 and 16, delete "$V_{t\ell}$" and insert --$V_{t1}$--.

In column 8, lines 28, delete "applifiers" and insert --amplifiers--.

Signed and Sealed this

Fourth Day of September 1984

[SEAL]

Attest:

GERALD J. MOSSINGHOFF

Attesting Officer    Commissioner of Patents and Trademarks